United States Patent
Zhang et al.

(10) Patent No.: US 9,905,583 B2
(45) Date of Patent: Feb. 27, 2018

(54) ARRAY SUBSTRATE HAVING SCANNING LINE AND SIGNAL LINES IN EXCHANGED LAYERS FOR MANUFACTURING DISPLAY APPARATUS

(71) Applicant: BOE TECHNOLOGY GROUP CO., LTD., Beijing (CN)

(72) Inventors: Li Zhang, Beijing (CN); Liangchen Yan, Beijing (CN); Jiangbo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/121,294

(22) PCT Filed: Nov. 17, 2015

(86) PCT No.: PCT/CN2015/094753
§ 371 (c)(1),
(2) Date: Aug. 24, 2016

(87) PCT Pub. No.: WO2016/095639
PCT Pub. Date: Jun. 23, 2016

(65) Prior Publication Data
US 2017/0012059 A1 Jan. 12, 2017

(30) Foreign Application Priority Data

Dec. 18, 2014 (CN) .......................... 2014 1 0796484

(51) Int. Cl.
*H01L 27/12* (2006.01)
(52) U.S. Cl.
CPC ........ *H01L 27/124* (2013.01); *H01L 27/1262* (2013.01)

(58) Field of Classification Search
CPC .......................... H01L 27/124; H01L 27/1262
See application file for complete search history.

(56) References Cited

FOREIGN PATENT DOCUMENTS

| CN | 101165904 A | 4/2008 |
| CN | 101510037 A | 8/2009 |

(Continued)

OTHER PUBLICATIONS

International Search Report dated Feb. 14, 2016 issued in corresponding International Application No. PCT/CN2015/094753 along with an English translation of the Written Opinion of the International Searching Authority.

(Continued)

*Primary Examiner* — Thanh V Pham
(74) *Attorney, Agent, or Firm* — Nath, Goldberg & Meyer; Joshua B. Goldberg

(57) ABSTRACT

The present invention provides an array substrate and a manufacturing method thereof, and a display apparatus. The array substrate comprises a gate layer, a gate insulating layer, an active layer, a source and drain layer, a scanning line and a signal line formed on a substrate, the signal line is provided in a same layer as the gate layer, the scanning line is provided in a same layer as the source and drain layer, the gate insulating layer is provided between the gate layer, the signal line and the active layer. The array substrate further comprises a first through hole and a second through hole penetrating through the gate insulating layer, the signal line is connected to the source and drain layer via the first through hole, and the scanning line is connected to the gate layer via the second through hole.

19 Claims, 5 Drawing Sheets

(56) References Cited

FOREIGN PATENT DOCUMENTS

| | | |
|---|---|---|
| CN | 102117824 A | 7/2011 |
| CN | 102779830 A | 11/2012 |
| CN | 104409462 A | 3/2015 |
| JP | 2005-141251 | 6/2005 |

OTHER PUBLICATIONS

Office Action dated Sep. 29, 2016 issued in corresponding Chinese Application No. 201410796484.5.

ARRAY SUBSTRATE HAVING SCANNING LINE AND SIGNAL LINES IN EXCHANGED LAYERS FOR MANUFACTURING DISPLAY APPARATUS

This is a National Phase Application filed under 35 U.S.C. 371 as a national stage of PCT/CN2015/094753, filed Nov. 17, 2015, an application claiming the benefit of Chinese Application No. 201410796484.5, filed Dec. 18, 2014, the content of each of which is hereby incorporated by reference in its entirety.

FIELD OF THE INVENTION

The present invention relates to a field of display technology, in particular relates to an array substrate and a manufacturing method thereof, and a display apparatus.

BACKGROUND OF THE INVENTION

In a field of large sized display (in particular, large sized liquid crystal display (LCD)) and organic light emitting diode (MED) display, since power supply lines (i.e., scanning lines) on a backboard have certain resistances and driving currents of all pixels are provided by the power supply lines, a power supply voltage at a region of the backboard closer to a power supply position is higher than the power supply voltage at a region of the backboard far away from the power supply position, this phenomenon is referred to as IR drop. Since a current is related to a voltage, current differences at different regions of the backboard may be caused by IR drop, resulting in mura defects of display.

Currently, main methods in the industry for coping with IR drop are to increase a thickness of a gate metal layer for forming the power supply lines (i.e., scanning lines) or employ a gate metal material having a smaller resistance so as to alleviate an influence of IR drop caused by the formed power supply lines. A general method is to form an ultra-thick (from 6000 Å to 9000 Å) aluminum alloy gate metal layer, wherein, the larger the size of a display panel is, the larger the thickness of the gate metal layer is. However, this method makes great demands on film quality, roughness and etching in subsequent processes of forming an insulating layer and an active layer, and the risk of leakage of electricity is very large. Another general method is to form the gate metal layer with a metal (e.g., copper alloy) having a lower resistance, but this method will result in problems of etching uniformity and cost controlling during a manufacturing procedure of a display panel in a certain specification.

SUMMARY OF THE INVENTION

In view of problems existing in the prior art, the present invention provides an array substrate and a manufacturing method thereof, and a display apparatus, which can increase a thickness of a power supply line without causing too much influence on formation processes of other structures, thus an influence of IR drop is suppressed.

In a first aspect, the present invention provides an array substrate comprising a gate layer, a gate insulating layer, an active layer, a source and drain layer, a scanning line and a signal line formed on a substrate, the signal line is provided in a same layer as the gate layer, the scanning line is provided in a same layer as the source and drain layer, the gate insulating layer is provided between the gate layer, the signal line and the active layer; the array substrate further comprises a first through hole and a second through hole penetrating through the gate insulating layer, the signal line is connected to the source and drain layer via the first through hole, and the scanning line is connected to the gate layer via the second through hole.

Optionally, the array substrate further comprises an etching stop layer provided above the active layer and the gate insulating layer.

Optionally, a first via-hole and a second via-hole are formed in the etching stop layer, a source electrode and a drain electrode of the source and drain layer are respectively in contact with both sides of the active layer through the first via-hole and the second via-hole.

Optionally, the first through hole and the second through hole also penetrate through the etching stop layer, the signal line is connected to the source and drain layer via the first through hole, and the scanning line is connected to the gate layer via the second through hole.

Optionally, the array substrate further comprises a passivation layer, a planarization layer and a pixel electrode layer, the passivation layer is provided above the source and drain layer, the planarization layer is provided above the passivation layer, the pixel electrode layer is provided above the planarization layer; the array substrate further comprises a third through hole penetrating through the passivation layer and the planarization layer, the pixel electrode layer is connected to the source and drain layer via the third through hole.

In a second aspect, the present invention provides a manufacturing method of array substrate, comprising steps of: forming a pattern including a gate layer and a signal line on a substrate; forming a pattern including a gate insulating layer and an active layer above the pattern including the gate layer and the signal line, the gate insulating layer is provided between the gate layer, the signal line and the active layer; forming a first through hole and a second through hole in the gate insulating layer; and forming a pattern including a source and drain layer and a scanning line, the signal line is connected to the source and drain layer via the first through hole, and the scanning line is connected to the gate layer via the second through hole.

Optionally, the first through hole is provided in a region of the array substrate where the source and drain layer and the signal line are overlapped with each other, the second through hole is provided in a region of the array substrate where the gate layer and the scanning line are overlapped with each other.

Optionally, the manufacturing method further comprises a step of: after forming the pattern including the gate insulating layer and the active layer, forming a pattern including an etching stop layer, and the etching stop layer is provided above the active layer and the gate insulating layer.

Optionally, the manufacturing method further comprises a step of: after forming the pattern including the etching stop layer, forming a first via-hole and a second via-hole in the etching stop layer, a source electrode and a drain electrode of the source and drain layer are respectively in contact with both sides of the active layer through the first via-hole and the second via-hole.

Optionally, the first through hole and the second through hole also penetrate through the etching stop layer, the signal line is connected to the source and drain layer via the first through hole, and the scanning line is connected to the gate layer via the second through hole.

Optionally, the manufacturing method further comprises steps of: forming a passivation layer and a planarization layer, and forming a third through hole penetrating through the passivation layer and the planarization layer; and forming a pixel electrode layer, the passivation layer is provided above the source and drain layer, the planarization layer is provided above the passivation layer, the pixel electrode layer is provided above the planarization layer, the pixel electrode layer is connected to the source and drain layer via the third through hole.

In a third aspect, the present invention further provides a display apparatus comprising any of array substrates as above.

From above technical solutions, the array substrate provided by the present invention employs a design in which the scanning line and the signal line in a pixel structure are exchanged, after the scanning line and the signal line are exchanged, the scanning line is moved from a bottom layer to be above the gate insulating layer, which solves a problem that the scanning line cannot be excessively thickened due to structural space limitation, facilitating to improve display uniformity of a display panel.

Moreover, the above design makes a thin film transistor in the array substrate to be a bottom-gate and top-contact type thin film transistor, compared with any other type thin film transistor, the bottom-gate and top-contact type thin film transistor has greater advantages in mask times, manufacturing time, manufacturing cost and device performance, for example, the bottom-gate and top-contact type thin film transistor may be formed by using a halftone mask technology so that the cost is significantly reduced; the bottom-gate and top-contact type thin film transistor has a stable performance and facilitates a driving control, and so on.

By using the manufacturing method described in embodiments of the present invention to manufacture the array substrate described above, the scanning line can be thickened, the resistance thereof is reduced, while the structure of the thin film transistor is not affected, the process difficulty is reduced; by using this type of thin film transistor, the uniformity and the yield of the array substrate are improved. Thus, the display apparatus comprising the array substrate has a better picture stability and a better display uniformity, which facilitates to improve the yield of product for manufacturers. Compared with other display apparatuses with a same size, the display apparatus of the present invention can reduce the process difficulty and improve the display uniformity and the picture stability.

Certainly, any product or method of the present invention may only possess a part of advantages described above.

BRIEF DESCRIPTION OF THE DRAWINGS

In order to more clearly explaining technical solutions in embodiments of the present invention, the accompanying drawings, which will be used for describing embodiments of the present invention, are briefly introduced below, obviously, the drawings described below only illustrate some embodiments of the present invention, a person skilled in the art can obtain other drawings in accordance with these drawings without any creative work. In the accompanying drawings.

REFERENCE SIGNS 10, substrate; 11, 12, gate layer; 13, signal line;
14, gate insulating layer; 15, active layer; 16, etching stop layer;
17, source and drain layer; 18, passivation layer; 19, planarization layer;
1A, pixel electrode layer; 21, first through hole;
22, first via-hole, second via-hole; 23, second through hole;
24, fourth through hole.

DETAILED DESCRIPTION OF THE EMBODIMENTS

To make objects, technical solutions and advantages of embodiments of the present invention more clear, the technical solutions in embodiments of the present invention will be described clearly and completely below in conjunction with the accompanying drawings in embodiment of the present invention, obviously, the described embodiments are only part embodiments of the present invention but not all embodiments of the present invention. All other embodiments obtained by a person skilled in the art based on embodiments of the present invention without any creative work fall into the protection scope of the present invention.

Figure 1:
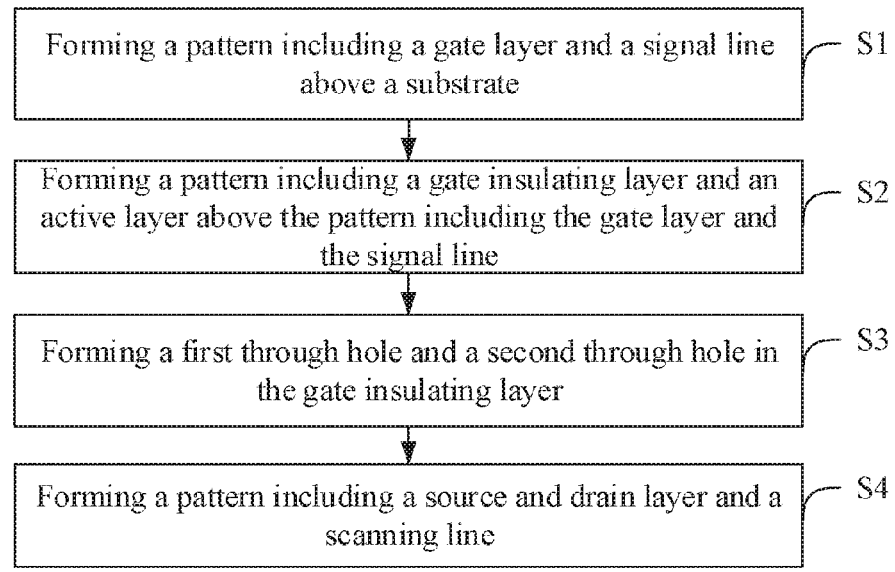
FIG. 1 is a flowchart diagram of a manufacturing method of array substrate in an embodiment of the present invention.

FIG. 1 shows a flowchart diagram of a manufacturing method of array substrate in an embodiment of the present invention. With reference to FIG. 1, the manufacturing method comprises: a step S1, forming a pattern including a gate layer and a signal line on a substrate; a step S2, forming a pattern including a gate insulating layer and an active layer above the pattern including the gate layer and the signal line; a step S3, forming a first through hole and a second through hole in the gate insulating layer; and a step S4, forming a pattern including a source and drain layer and a scanning line, wherein, the gate insulating layer is provided between the gate layer, the signal line and the active layer, the signal line is connected to the source and drain layer via the first through hole, and the scanning line is connected to the gate layer via the second through hole.

It should be noted that, the first through hole is used for connecting the signal line with the source and drain layer, the second through hole is used for connecting the scanning line with the gate layer, thus the first through hole and the second through hole may be formed not only in the gate insulating layer but also in other layer structures between the scanning line and the gate layer or between the signal line and the source and drain layer.

It can be seen that, in the embodiment of the present invention, the scanning line, which is generally provided in a same layer as the gate layer in a conventional process, and the signal line, which is generally provided in a same layer as the source and drain layer in a conventional process, are exchanged, and in order not to change the related electrical connection relationships, the first through hole is used to connect the signal line with the source and drain layer, and the second through hole is used to connect the scanning line and the gate layer. Such a design makes that, after the scanning line and the signal line are exchanged, the scanning line is moved from a bottom layer to be above the gate insulating layer, which solves a problem that the scanning line cannot be excessively thickened due to structural space limitation, facilitating to improve display uniformity of a display panel. Moreover, by using the manufacturing method of array substrate of the present invention, the scanning line in the array substrate may be thickened without significant influence on processes for forming other structures in the array substrate, the resistance of the scanning line is reduced, and the process difficulty of the manufacturing method is lowered.

Optionally, the first through hole is provided in a region of the array substrate where the source and drain layer and the signal line are overlapped with each other, the second through hole is provided in a region of the array substrate where the gate layer and the scanning line are overlapped with each other. Such a design in which the through holes are provided in the overlapped regions can ensure normal electrical connections between structures in the array substrate, and in another aspect, resistances of the signal line and the scanning line will not be greatly increased.

In an embodiment of the present invention, the step S2 may include following steps S201 and S202 (not shown in FIG. 1).

Step S201, forming a pattern including the gate insulating layer, the gate insulating layer is provided above the pattern including the gate layer and the signal line.

Step S202, forming a pattern including the active layer, the active layer is provided in a region on the gate insulating layer corresponding to the gate layer, wherein the active layer may be formed of zinc-oxide-based transparent oxide semiconductor material such as IGZO, ITZO, AZO, ZnON, or may be formed of semiconductor material such as polycrystalline silicon, amorphous silicon, which is not limited in the present invention.

Further, the manufacturing method may further comprise: a step S203 (not shown in FIG. 1), after forming the pattern including the gate insulating layer and the active layer, forming a pattern including an etching stop layer, the etching stop layer is provided above the active layer and the gate insulating layer.

In order to form an electrical connection between the source and drain layer and the active layer, the manufacturing method may further comprise a step S204 (not shown in FIG. 1): after forming the pattern including the etching stop layer, forming a first via-hole and a second via-hole in the etching stop layer.

In the present embodiment, the first via-hole and the second via-hole are used for forming the electrical connection between the source and drain layer and the active layer, specifically, a source and a drain of the source and drain layer are respectively in contact with both sides of the active layer through the first via-hole and the second via-hole.

In addition, the first through hole and the second through hole also penetrate through the etching stop layer, the signal line is connected to the source and drain layer via the first through hole, and the scanning line is connected to the gate layer via the second through hole.

As above, the gate insulating layer, the active layer, the etching stop layer, the source and drain layer, and the gate layer may constitute necessary structures of a thin film transistor so as to achieve necessary functions of the thin film transistor.

Optionally, in addition to the steps shown in FIG. 1, the manufacturing method may further comprise: a step S5, forming a passivation layer and a planarization layer and forming a third through hole penetrating through the passivation layer and the planarization layer; a step S6, forming a pixel electrode layer, wherein the passivation layer is provided above the source and drain layer, the planarization layer is provided above the passivation layer, the pixel electrode layer is provided above the planarization layer, and the pixel electrode layer is connected to the source and drain layer via the third through hole.

If required, the pixel electrode layer may be a transparent conductive layer, or may be an opaque conductive layer. Specifically, the pixel electrode layer may be a pixel electrode of a liquid crystal panel, and in this case, the pixel electrode layer is a transparent conductive layer; the pixel electrode layer may also be a bottom electrode in an OLED display panel, and in this case, the pixel electrode layer may be a transparent conductive layer or may be an opaque conductive layer, which allows bonding of the array substrate and another structure and an electrical connection therebetween.

More specifically, FIGS. 2-12 show schematic diagrams of intermediate structures in steps of the manufacturing method of an array substrate suitable for an MED display panel.

Figure 2:
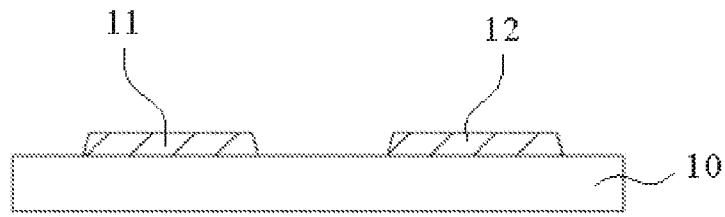
FIG. 2 is a schematic diagram of forming a gate layer in an embodiment of the present invention.
Figure 3:
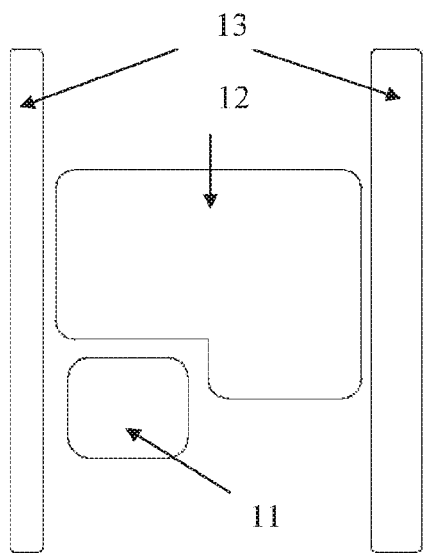
FIG. 3 is a top view diagram of positions of a gate layer and a signal line in an embodiment of the present invention.

With reference to FIGS. 2 and 3, the step S1 may specifically comprise: depositing a metal layer above a substrate 10, and forming the gate layers 11, 12 and the signal line 13 in different regions by a patterning process. Specifically, the gate layer 11, 12 and/or the signal line 13 may be formed of an elementary substance or alloy including any one or more of metal elements of Al, Mo, Cu, Nd, Ti.

In the present embodiment, the gate layers 11, 12 respectively correspond to a switching transistor and a driving transistor, and certainly, in other embodiments of the present invention, the gate layer may be in other shapes or divided into other number of parts, which are not limited in the present invention.

In the present embodiment, the signal line 13 specifically includes a data line at left side of FIG. 3 and a power supply line at right side of FIG. 3, this structure corresponds to a pixel unit structure in an array substrate of an OLED display panel. Certainly, with respect to other types of display panels, the signal line may include only one data line, or a plurality of data lines in parallel, or different types of lines, which is not limited in the present invention.

In the present embodiment, the patterning process generally includes applying of photoresist, exposure, developing, etching, stripping off photoresist, and so on, which is not specifically limited in the present invention, as long as desired patterns can be formed by the process, such as printing and other patterning processes.

Figure 4:
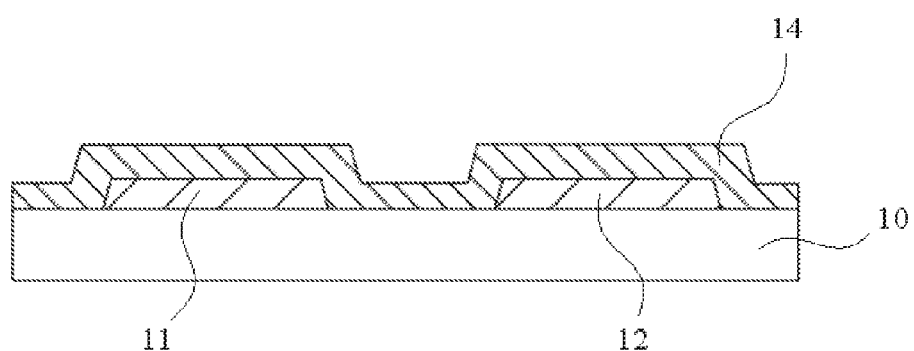
FIG. 4 is a schematic diagram of forming a gate insulating layer in an embodiment of the present invention.

With reference to FIG. 4, the step S201 may specifically comprise: depositing the gate insulating layer 14 with a conventional thickness above the pattern including the gate layers 11, 12 and the signal line 13, generally, the gate insulating layer 14 covers the whole surface of the substrate formed with the pattern including the gate layers 11, 12 and the signal line 13. Furthermore, in another embodiment of the present invention, the first through hole and the second through hole may also be formed in the gate insulating layer 14 by a patterning process while depositing the gate insulating layer 14.

Figure 5:
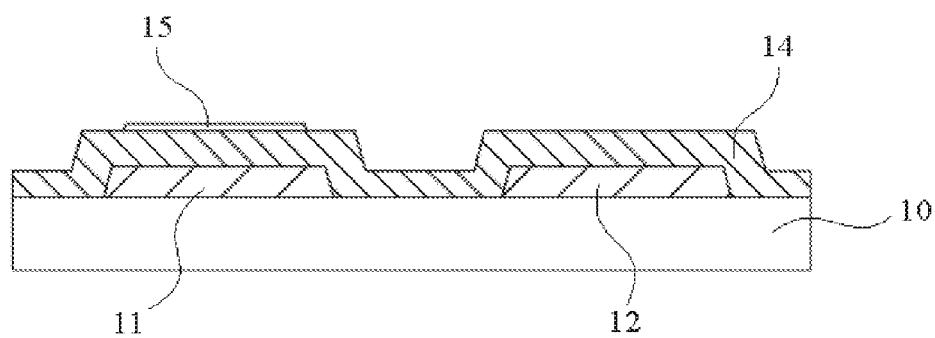
FIG. 5 is a schematic diagram of forming an active layer in an embodiment of the present invention.
Figure 6:
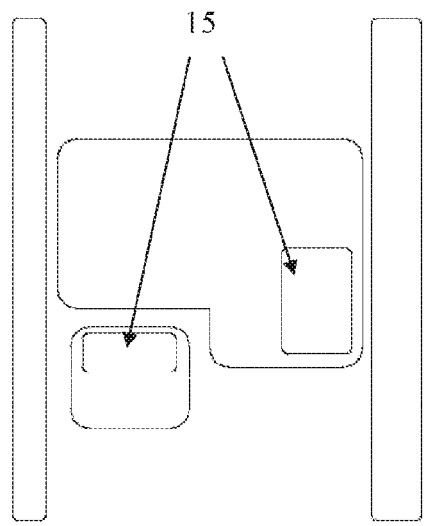
FIG. 6 is a top view diagram of a position of an active layer in an embodiment of the present invention.

With reference to FIGS. 5 and 6, the step S202 may specifically comprise: forming the active layer 15 by depositing material such as polycrystalline silicon in a region above the gate insulating layer 14 corresponding to the gate layers 11, 12 and by a patterning process, the type of the thin film transistor depends on the specific material of the active layer 15.

Figure 7:
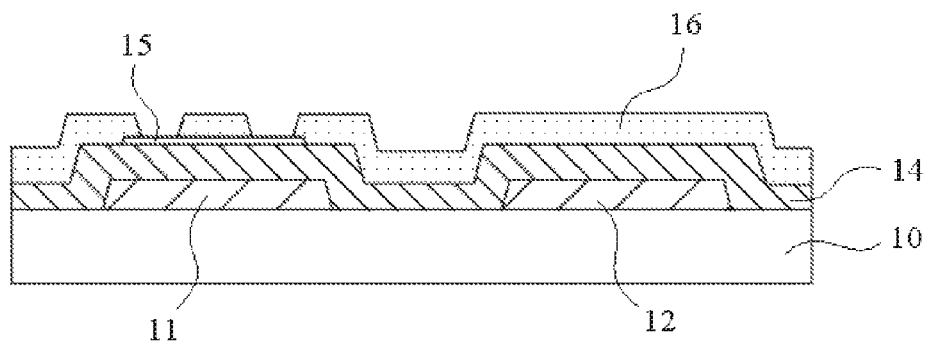
FIG. 7 is a schematic diagram of forming an etching stop layer in an embodiment of the present invention.

With reference to FIG. 7, the step S203 may specifically comprise: forming the etching stop layer 16 by a patterning process, the etching stop layer 16 is provided above the active layer 15 and the gate insulating layer 14.

Figure 8:
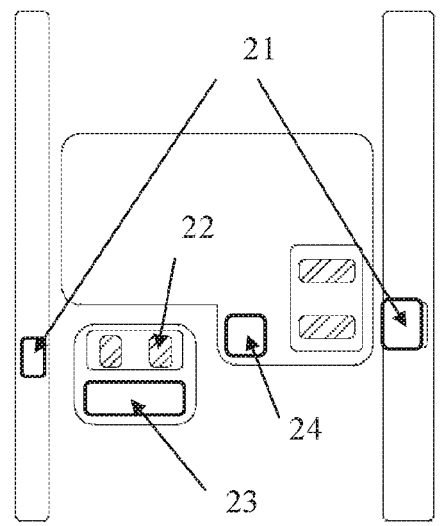
FIG. 8 is a top view diagram of positions of a first via-hole, a second via-hole, a first through hole, a second through hole and a fourth through hole in an embodiment of the present invention.

FIG. 8 shows the first and second via-holes 22 formed in the step S204 and positions on the etching stop layer and the gate insulating layer, at which the first through hole 21 and the second through hole 23 are required to be formed.

The first through hole 21 is provided in a region where the source and drain layer and the signal line 13 are overlapped, specifically, the first through hole 21 penetrates through the etching stop layer 16 and the gate insulating layer 14 for connecting the signal line 13 with the source and/or the drain of the source and drain layer.

The second through hole 23 is provided in a region where the gate layer 11 and the scanning line are overlapped, specifically, the second through hole 23 penetrates through the etching stop layer 16 and the gate insulating layer 14 for connecting the gate layer 11 with the scanning line.

The first and second via-holes 22 are provided in a region of the source and drain layer 17 corresponding to the source and the drain, and penetrate through the etching stop layer 16 for connecting the active layer 15 with the source and the drain of the source and drain layer 17.

When there are a plurality of transistors, a fourth through hole 24 may further be formed in the etching stop layer and the gate insulating layer, the fourth through hole 24 is provided in a region, wherein the source and the drain of a switching transistor and the gate layer 12 of a driving transistor are overlapped, for connecting the gate electrode of the driving transistor with the source or the drain of the switching transistor. Herein, a manner in which the gate electrode of one transistor is connected to the source or the drain of another transistor is described by taking the fourth through hole 24 as an example, when there are a plurality of transistors. Certainly, it is not necessary to form a through hole similar to the fourth through hole when there is a different circuit structure in a pixel unit.

Figure 9:
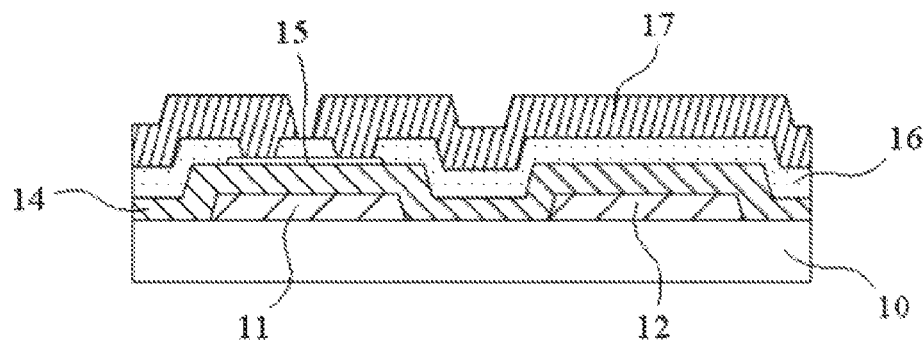
FIG. 9 is a schematic diagram of forming a source and drain layer in an embodiment of the present invention.

With reference to FIG. 9, the step S4 may specifically comprise: forming the source and drain layer 17 and the scanning line by depositing and patterning processes, the source and drain layer 17 is in contact with both sides of the active layer 15 through the first via-hole and the second via-hole (denoted by reference signs 22 in FIG. 8) respectively.

Figure 10:
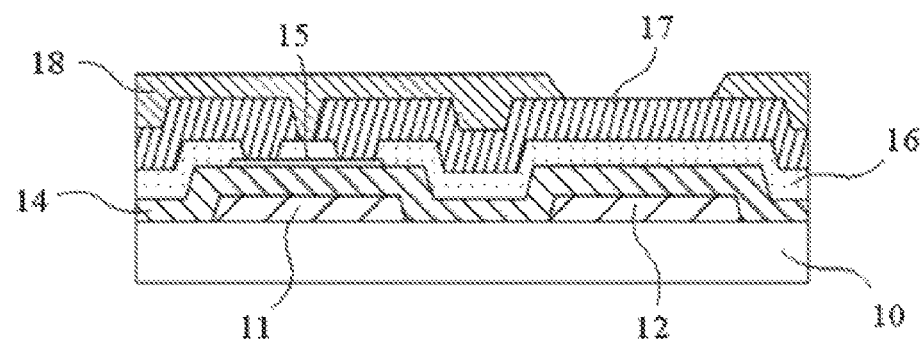
FIG. 10 is a schematic diagram of forming a passivation layer in an embodiment of the present invention.
Figure 11:
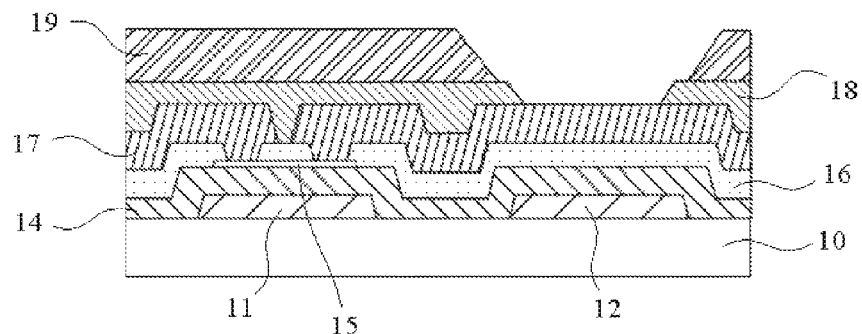
FIG. 11 is a schematic diagram of forming a planarization layer in an embodiment of the present invention.
Figure 12:
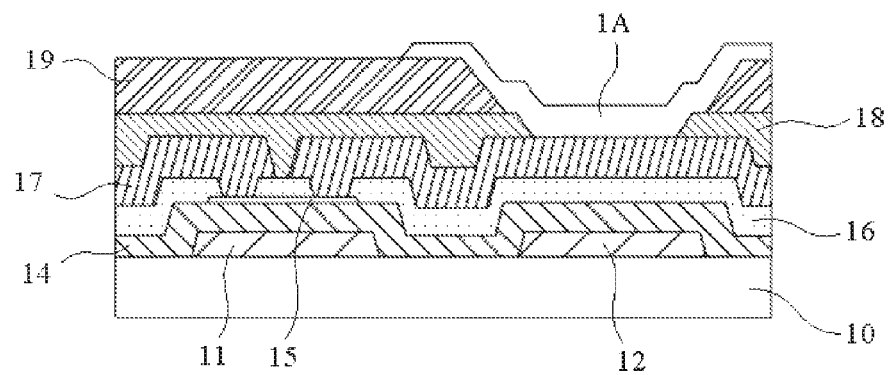
FIG. 12 is a schematic diagram of forming a pixel electrode layer in an embodiment of the present invention.

With reference to FIGS. 10 to 12, the step S5 specifically comprises: forming the passivation layer 18 by depositing and patterning processes, and meanwhile, forming the third through hole for connecting the pixel electrode layer with the source and drain layer 177 forming the planarization layer 19 by a patterning process, and meanwhile, forming the third through hole for connecting the pixel electrode layer with the source and drain layer 17. The step S6 specifically comprises: forming the pixel electrode layer 1A by depositing and patterning processes, the pixel electrode layer 1A is connected to the source and drain layer 17 via the third through hole. So far, the main structure of the array substrate is formed. In the present embodiment, the planarization layer 19 may have a thickness more than 1 μm, and is formed of organic material, which can avoid influence of the thickness of the source and drain layer on the subsequent films and leakage of electricity.

Another embodiment of the present invention provides an array substrate, by using examples shown in FIGS. 8 and 12, the array substrate comprises gate layers 11, 12, a gate insulating layer 14, an active layer 15, a source and drain layer 17, a scanning line (in a region above and corresponding to 23 in FIG. 8) and a signal line 13 formed above a substrate 10, the signal line 13 is provided in a same layer as the gate layers 11, 12, the scanning line is provided in a same layer as the source and drain layer 17, and the gate insulating layer 14 is provided between the gate layers 11, 12, the signal line 13 and the active layer 15.

The array substrate may further comprise a first through hole 21 and a second through hole 23 penetrating through the gate insulating layer 14, the signal line 13 is connected to the source and drain layer 17 via the first through hole 21, and the scanning line is connected to the gate layer 11 via the second through hole 23.

It also can be seen from FIG. 12 that, the array substrate further comprises an etching stop layer 16 provided above the active layer 15 and the gate insulating layer 14.

Moreover, first and second via-holes 22 are further formed in the etching stop layer 14, the source and drain layer 17 is in contact with both sides of the active layer 15 through the first and second via-holes 22 respectively.

The first through hole 21 and the second through hole 23 also penetrate through the etching stop layer 16, the signal line 13 is connected to the source and drain layer 17 via the first through hole 21, the scanning line is connected to the gate layer 11 via the second through hole.

In addition, the array substrate may further comprise a passivation layer 18, a planarization layer 19 and a pixel electrode layer 1A, the passivation layer 18 is provided above the source and drain layer 17, the planarization layer 19 is provided above the passivation layer 18, the pixel electrode layer 1A is provided above the planarization layer 19, wherein, the planarization layer 19 for example has a thickness more than 1 μm and is formed of organic material, which can avoid influence of the thickness of the source and drain layer on the subsequent films and avoid leakage of electricity.

The array substrate may further comprise a third through hole penetrating through the passivation layer 18 and the planarization layer 19, the pixel electrode layer 1A is connected to the source and drain layer 17 via the third through hole.

It should be noted that, the first through hole 21 and the second through hole 23 are not shown in FIG. 12, and with reference to FIG. 8, the first through hole 21 and the second through hole 23 are formed in one or more intermediate layers, for example, the first through hole 21 and the second through hole 23 may penetrate through the etching stop layer 16 and the gate insulating layer 14. The array substrate may be manufactured by any manufacturing method of array substrate described above, and a specific structure thereof is shown in FIG. 12. Thus, the array substrate of the present invention has technical features corresponding to any manufacturing method of array substrate described above, thereby can solve a same technical problem and achieve a same technical effect as the manufacturing method of array substrate.

Figure 13:
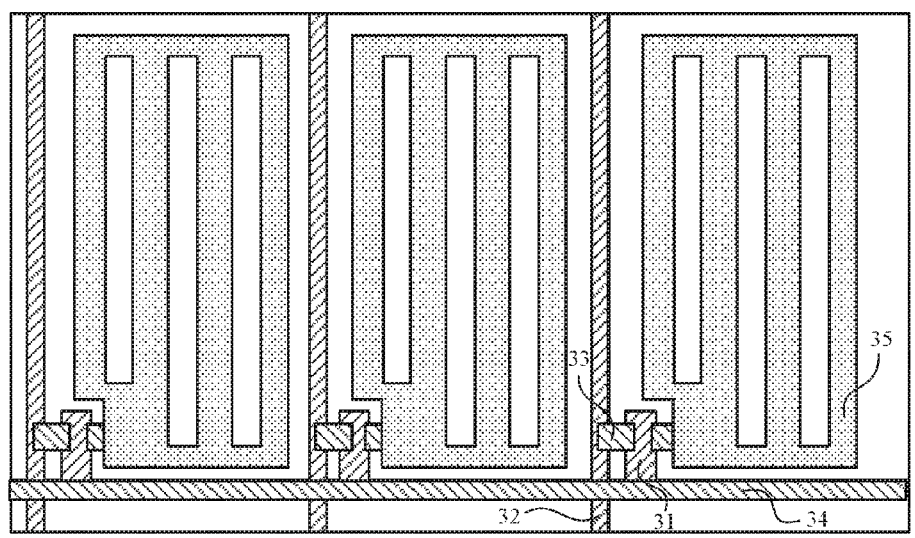
FIG. 13 is a top view diagram of an array substrate suitable for a liquid crystal display panel in an embodiment of the present invention.

In addition, similar to the structure of the array substrate suitable for an OLED display panel, the array substrate provided by the embodiment of the present invention may also have a structure suitable for a liquid crystal display panel, which is shown in FIG. 13. With reference to FIG. 13, when forming the scanning line 34, the signal line 32, and the gate layer 31 and the source and drain layer 33 of a thin film transistor in each pixel unit, a pattern including the gate layer 31 and the signal line 32 may be first formed above the substrate so that the gate layer 31 and the signal line 32 in the array substrate are formed in a same layer; then an insulating layer covering the gate layer 31 and the signal line 32 is formed, and a first through hole and a second through hole are formed at corresponding positions of the insulating layer, next, the source and drain layer 33 and the scanning line 34 are formed so that the source and drain layer 33 is connected to the signal line 32 via the first through hole (which is not shown in the figure, and corresponds to a position at which the source and drain layer 33 and the signal line 32 are overlapped), the gate layer 31 is connected to the scanning line 34 via the second through hole (which is not shown in the figure, and corresponds to a position at which the gate layer 31 and the scanning line 34 are overlapped), and the gate layer 31 and the signal line 32 in the array substrate are formed in a same layer. Similarly, the structure and the manufacturing process of the insulating layer, and the structures and the manufacturing processes of other configurations of the array substrate all may be referred to the embodiments described above, and will not repeatedly described here. However, it can be seen from FIG. 13 that, the array substrate has a pixel electrode 35 in a strip shape, and has a typical structure suitable for a liquid crystal display panel. Certainly, the array substrate of the present invention is not limited to be applied into an OLED display panel or a liquid crystal display panel.

A still another embodiment of the present invention provides a display apparatus comprising the array substrate described above. As well known by persons skilled in the art, the array substrate described above may be applied for liquid crystal displaying or OLED displaying, thus, it may be combined with different devices to form a liquid display apparatus or an OLED display apparatus, and certainly, in order to realize a display function, the array substrate may further comprise other structures not mentioned in the present application.

The display apparatus may be any product or member having display function, such as electronic paper, mobile phone, tablet computer, television, notebook computer, digital photo frame, navigator, and so on. The display apparatus of the present embodiment has the same technical features as the array substrate described above, thus it can solve the same technical problem and achieve the same technical effect.

As above, the present invention provides an array substrate and a manufacturing method thereof, and a display apparatus, which can increase a thickness of a power supply line without causing too much influence on formation processes of other structures, thus an influence of IR drop is suppressed.

The present invention has following advantages.

1. Currently, in a large sized flat panel display, ultra-thick aluminum metal layers and ultra-thick insulating layers are widely used; in the present invention, the metal layers of the scanning line and the signal line are exchanged so that the use of ultra-thick aluminum metal layers and ultra-thick insulating layers is avoided, strict requirements for thickness, film quality, roughness and etching effect in manufacturing, processes of the subsequent insulating layer and the active layer are reduced, thus problems of leakage of electricity are reduced, which is helpful to improve the yield of products.

2. Conventional thicknesses of the gate electrode and the insulating layer facilitate to flatten edge-cross lines and increase wiring density.

3. In the present invention, the metal layers of the scanning line and the signal line are exchanged so that the scanning line required to be thickened due to resistance is moved from a bottom layer to be above the gate insulating layer, which solves a problem that the scanning line cannot be excessively thickened due to structural space limitation, facilitating to improve display uniformity of a display panel.

4. The thickness of the scanning line is increased so that the IR drop is alleviated without compensation of other measures, facilitating to reduce the cost of products.

It should be noted that, in the figures, for clear showing, sizes of layers and regions may be exaggerated. It should be understood that, when an element or a layer is referred to be "above" another element or layer, it may be directly on another element or layer, or there may be intermediate layers therebetween. Moreover, it should be understood that, when an element or a layer is referred to be "below" another element or layer, it may be directly under another element or layer, or there may be one or more intermediate layers or elements therebetween. In addition, it should be understood that, when a layer or an element is referred to be "between" two layers or two elements, it may be the only layer between the two layers or the two elements, or there may be one or more intermediate layers or elements between the two layers or the two elements. Similar reference signs throughout the drawings indicate similar elements.

Furthermore, in the present application, relationship terms such as first and second are only used to differentiate an entity or operation from another entity or operation, and are not necessarily require or imply that there is any practical relationship or order between these entities or operations. Terms of "comprise", "include" or any other variant are non-exclusive, thus, the procedure, method, article or apparatus comprising a series of elements not only comprises these elements but also may comprise other elements not listed definitely, or further comprises intrinsic elements thereof. Without further limitation, an element limited by words of "comprising one . . . " does not exclude that additional same elements are also contained.

It also should be explained that, terms that indicate orientations or position relationships, such as "above", "below", are based on orientations or position relationships shown in the drawings, which are only used to facilitate the description of the present invention and to simplify description, but not to indicate or imply that the referred device or element must have a specific orientation, must be constructed and operated in a specific orientation, thus, the present invention is not limited thereto. Unless definitely specified and limited additionally, terms of "install" and "connect" should be understood in a broad sense, for example, the connection may be a fixed connection, and may also be a detachable connection, or an integral connection; may be a mechanical connection, and may also be an electrical connection; may be a direct connection, and may also an indirect connection via an intermediate medium, may be an internal connection between two components. For ordinary persons skilled in the art, the terms in the present invention may be understood according to specific situations.

The embodiments described above are merely used for describing technical solutions of the present invention, but not limiting the present invention thereto. Although the present invention is explained in detail with reference to the embodiments described above, a person of ordinary skill in the art should understand that, various variations of technical solutions or equivalent substitutions of part technical features in the embodiments described above can be made without departing from the spirit and essence of technical solutions in embodiments of the present invention, and those variations and substitutions shall also be regarded as falling into the protection scope of the present invention.

The invention claimed is:

1. An array substrate, comprising a gate layer, a gate insulating layer, an active layer, a source and drain layer, a scanning line and a signal line formed on a substrate, wherein
the signal line is provided in a same layer as the gate layer, the scanning line is provided in a same layer as the source and drain layer, the gate insulating layer is provided between the gate layer, the signal line and the active layer;
the array substrate further comprises a first through hole and a second through hole penetrating through the gate insulating layer, the signal line is connected to the source and drain layer via the first through hole, and the scanning line is connected to the gate layer via the second through hole.

2. The array substrate of claim 1, further comprises an etching stop layer provided above the active layer and the gate insulating layer.

3. The array substrate of claim 2, wherein a first via-hole and a second via-hole are formed in the etching stop layer, a source electrode and a drain electrode of the source and drain layer are respectively in contact with both sides of the active layer through the first via-hole and the second via-hole.

4. The array substrate of claim 2, wherein the first through hole and the second through hole also penetrate through the etching stop layer.

5. The array substrate of claim 1, further comprises a passivation layer, a planarization layer and a pixel electrode layer, wherein,
the passivation layer is provided above the source and drain layer, the planarization layer is provided above the passivation layer, the pixel electrode layer is provided above the planarization layer,
the array substrate further comprises a third through hole penetrating through the passivation layer and the planarization layer, the pixel electrode layer is connected to the source and drain layer via the third through hole.

6. The array substrate of claim 2, further comprises a passivation layer, a planarization layer and a pixel electrode layer, wherein,
the passivation layer is provided above the source and drain layer, the planarization layer is provided above the passivation layer, the pixel electrode layer is provided above the planarization layer,
the array substrate further comprises a third through hole penetrating through the passivation layer and the planarization layer, the pixel electrode layer is connected to the source and drain layer via the third through hole.

7. The array substrate of claim 3, further comprises a passivation layer, a planarization layer and a pixel electrode layer, wherein,
the passivation layer is provided above the source and drain layer, the planarization layer is provided above the passivation layer, the pixel electrode layer is provided above the planarization layer,
the array substrate further comprises a third through hole penetrating through the passivation layer and the planarization layer, the pixel electrode layer is connected to the source and drain layer via the third through hole.

8. The array substrate of claim 4, further comprises a passivation layer, a planarization layer and a pixel electrode layer, wherein,
the passivation layer is provided above the source and drain layer, the planarization layer is provided above the passivation layer, the pixel electrode layer is provided above the planarization layer,
the array substrate further comprises a third through hole penetrating through the passivation layer and the planarization layer, the pixel electrode layer is connected to the source and drain layer via the third through hole.

9. A display apparatus, comprising the array substrate of claim 1.

10. A manufacturing method of an array substrate, comprising steps of:
forming a pattern including a gate layer and a signal line on a substrate, the signal line is provided in a same layer as the gate layer;
forming a pattern including a gate insulating layer and an active layer above the pattern including the gate layer and the signal line, the gate insulating layer is provided between the gate layer, the signal line and the active layer;
forming a first through hole and a second through hole in the gate insulating layer; and
forming a pattern including a source and drain layer and a scanning line, the scanning line is provided in a same layer as the source and drain layer, the signal line is connected to the source and drain layer via the first through hole, and the scanning line is connected to the gate layer via the second through hole.

11. The manufacturing method of claim 10, wherein the first through hole is provided in a region of the array substrate where the source and drain layer and the signal line are overlapped with each other, the second through hole is provided in a region of the array substrate where the gate layer and the scanning line are overlapped with each other.

12. The manufacturing method of claim 10, further comprises a step of:
after forming the pattern including the gate insulating layer and the active layer, forming a pattern including an etching stop layer, and the etching stop layer is provided above the active layer and the gate insulating layer.

13. The manufacturing method of claim 12, further comprises a step of:
after forming the pattern including the etching stop layer, forming a first via-hole and a second via-hole in the etching stop layer, wherein,
a source electrode and a drain electrode of the source and drain layer are respectively in contact with both sides of the active layer through the first via-hole and the second via-hole.

14. The manufacturing method of claim 12, wherein the first through hole and the second through hole also penetrate through the etching stop layer.

15. The manufacturing method of claim 10, further comprises steps of:
forming a passivation layer and a planarization layer, and forming a third through hole penetrating through the passivation layer and the planarization layer; and
forming a pixel electrode layer,
wherein the passivation layer is provided above the source and drain layer, the planarization layer is provided above the passivation layer, the pixel electrode layer is provided above the planarization layer, the pixel electrode layer is connected to the source and drain layer via the third through hole.

16. The manufacturing method of claim 11, further comprises steps of:
forming a passivation layer and a planarization layer, and forming a third through hole penetrating through the passivation layer and the planarization layer; and
forming a pixel electrode layer,
wherein the passivation layer is provided above the source and drain layer, the planarization layer is provided above the passivation layer, the pixel electrode layer is provided above the planarization layer, the pixel electrode layer is connected to the source and drain layer via the third through hole.

17. The manufacturing method of claim 12, further comprises steps of:
forming a passivation layer and a planarization layer, and forming a third through hole penetrating through the passivation layer and the planarization layer; and
forming a pixel electrode layer,
wherein the passivation layer is provided above the source and drain layer, the planarization layer is provided above the passivation layer, the pixel electrode layer is provided above the planarization layer, the pixel electrode layer is connected to the source and drain layer via the third through hole.

18. The manufacturing method of claim 13, further comprises steps of:
forming a passivation layer and a planarization layer, and forming a third through hole penetrating through the passivation layer and the planarization layer; and
forming a pixel electrode layer,
wherein the passivation layer is provided above the source and drain layer, the planarization layer is provided above the passivation layer, the pixel electrode layer is provided above the planarization layer, the pixel electrode layer is connected to the source and drain layer via the third through hole.

19. The manufacturing method of claim 14, further comprises steps of:
forming a passivation layer and a planarization layer, and forming a third through hole penetrating through the passivation layer and the planarization layer; and
forming a pixel electrode layer,
wherein the passivation layer is provided above the source and drain layer, the planarization layer is provided above the passivation layer, the pixel electrode layer is provided above the planarization layer, the pixel electrode layer is connected to the source and drain layer via the third through hole.

* * * * *